United States Patent [19]

Yilmaz

[11] Patent Number: 4,641,162

[45] Date of Patent: Feb. 3, 1987

[54] CURRENT LIMITED INSULATED GATE DEVICE

[75] Inventor: Hamza Yilmaz, Dewitt, N.Y.

[73] Assignee: General Electric Company, Research Triangle Park, N.C.

[21] Appl. No.: 807,597

[22] Filed: Dec. 11, 1985

[51] Int. Cl.$^4$ ............................................. H01L 29/06
[52] U.S. Cl. ..................................... 357/23.4; 357/20; 357/38; 357/86
[58] Field of Search ...................... 357/20, 23.4, 38, 86

[56] References Cited

U.S. PATENT DOCUMENTS 4,580,154  4/1986  Coe .................................... 357/23.4

Primary Examiner—Joseph E. Clawson, Jr.
Attorney, Agent, or Firm—Stanley C. Corwin; Mark Mollon

[57] ABSTRACT

A current limited insulated gate transistor (IGT) is disclosed wherein the individual cells are rectangular and each has four discrete, mutually spaced emitter regions to provide a reduced gate periphery. Each cell lacks emitter portions at the cell corners to reduce current crowding in the corner areas. The size of each cell is kept small to decrease the forward voltage drop of the IGT at its operating current level and the spacing between individual cells of the IGT is minimized in order to further reduce the maximum IGT current. These features enable the cell to survive a short-circuit load condition by preventing the maximum current from reaching the latch-up level.

15 Claims, 7 Drawing Figures

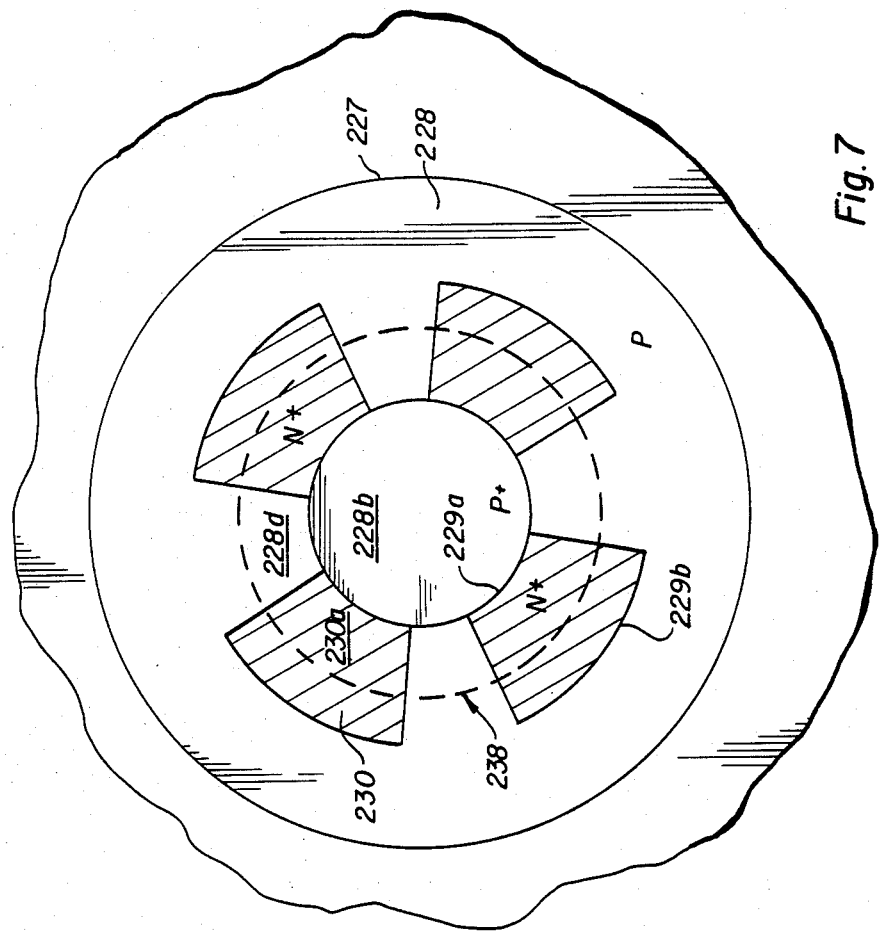

CURRENT LIMITED INSULATED GATE DEVICE

The present invention relates in general to semiconductor devices and more specifically to the structure of an insulated gate semiconductor device.

BACKGROUND OF THE INVENTION

Among insulated gate devices, (IGD), the insulated gate transistor (IGT) is a device capable of controlling a high device current with a low bias voltage applied to its gate electrode. This gate control characteristic makes the IGT particularly useful for power control and current switching applications. A typical IGT comprises a plurality of small, parallel-connected cells fabricated in a semiconductor substrate or wafer. Each cell comprises, in series, adjacent collector, drift, base and emitter regions of alternate conductivity types.

A gate electrode is insulatively separated from the semiconductor substrate by an insulating region which includes a plurality of contact windows. Each contact window overlies one of the cells and is centered thereon so as to expose adjacent emitter and base region surfaces. Collector and emitter electrodes are connected, respectively, at opposite ends of each cell and conduct the current into and out of the cell. The magnitude of the device current is controlled by the magnitude of a bias voltage applied to the gate electrode by a gate control circuit. A typical collector electrode may comprise a conductive layer in continuous ohmic contact with a single, distributed collector region, the latter shared by all the cells in the wafer. In contrast, a typical emitter electrode comprises a conductive layer which makes ohmic contact with each cell only at the emitter and base region surface portions exposed within each contact window.

Prior art devices are typically constructed with a plurality of small, mutually spaced, square, rectangular or circular contact windows, each of which exposes a similarly sized and shaped cell. Each such cell has a cell emitter region surrounding a central base portion, wherein the emitter region surface is disposed continuously along the cell window periphery. The portion of the base region underlying the gate electrode and adjacent the base region surface becomes a channel for current conduction upon application of the appropriate bias voltage to the gate electrode. Current flows from the collector electrode, through the collector and drift regions, then through the channel across an emitter-base junction, through the emitter region, and into the emitter electrode. Each channel and each emitter region has a shape approaching that of half a toroid formed by the intersection of a plane at right angles to the toroid axis. Depending on whether the toroid has a round, square or rectangular shape, a contact window of similar shape is provided and is defined by the intersecting plane.

The gate bias voltage controls the depth of the channel, as measured from the intersecting plane. The maximum current which the channel for a particular cell can conduct is proportional to the cross-sectional area of the channel available for current flow. A limit on this cross-sectional area is the width of the emitter-base junction available for current flow from the channel to the emitter region. The width of the emitter-base junction normal to current flow from the channel to the emitter region defines the cell gate periphery.

Under certain conditions, either during turn-on or during operation of the IGT, the load which is being driven by the IGT may be shorted-out. Under these conditions, the IGT may be simultaneously exposed to full line voltage and high current, which may cause the destruction of the device.

Another problem associated with a short circuit is latch-up of the IGT, which results in loss of gate control. This can occur when the device current exceeds a certain threshold. However, if the IGT can survive under conditions of simultaneous high current and high voltage long enough for the condition to be sensed, i.e. for about 10 microseconds, and if the IGT does not latch up during this interval, the gate control circuit will be able to turn the device off.

Still another concern relating to the operation of IGTs is the forward voltage drop across the device at its operating current. A high forward voltage drop results in problems of device power consumption and device heating which may adversely impact device operation.

OBJECTS OF THE INVENTION

It is therefore a primary object of the present invention to provide a new and improved insulated gate semiconductor device which is not subject to the foregoing problems and disadvantages.

It is a further object of the present invention to provide an insulated gate semiconductor device capable of surviving a short-circuit load condition.

It is another object of the present invention to provide an insulated gate semiconductor device wherein the maximum device current under short circuit conditions is prevented from reaching the latch-up level of the device.

It is still another object of the present invention to provide an insulated gate semiconductor device which has a relatively low forward voltage drop at its operating current level.

SUMMARY OF THE INVENTION

These and other objects of the invention are achieved through the use of a new and improved insulated gate device (IGD) comprising a current limited insulated gate transistor (IGT) having a plurality of cells. The gate periphery of each cell and the spacing between individual cells are reduced to pre-selected magnitudes. The characteristics achieved by these reductions from the norm act separately and in combination to limit the magnitude of the device current and, thus, to prevent the destruction of the device in the event of a load short-circuit.

In accordance with a preferred embodiment of the present invention, an IGT is fabricated on a single semiconductor chip in which emitter formation has been blocked from the part of each cell most likely to cause latch-up. For rectangular cells, this involves blocking formation of the emitter region corners. Further, the cells are smaller and more closely spaced than is typically the case in such devices. By blocking emitter formation during cell fabrication, each cell is provided with a plurality of mutually spaced emitter regions. Each such emitter region forms a separate emitter-base junction with the cell base region, as compared to the single emitter region disposed continuously around the contact window periphery in prior art devices. Thus, the formation of separate emitter-base junctions effects a reduction of the cell gate periphery. In operation, the decrease in the gate periphery of each cell and the narrower cell spacing jointly prevent the maximum device current from reaching the latch-up current level. Further, because of the relatively small size of each cell, the forward voltage drop of the IGT at its operating current level is reduced.

These and other objects of the invention, together with the features and advantages thereof, will be better understood from a consideration of the following specification when read in conjunction with the drawings herein.

BRIEF DESCRIPTION OF THE DRAWINGS

FIG. 7 is a plan view illustrating selected features of a representative cell in the IGT of FIG. 6.

DETAILED DESCRIPTION

Figure 1:
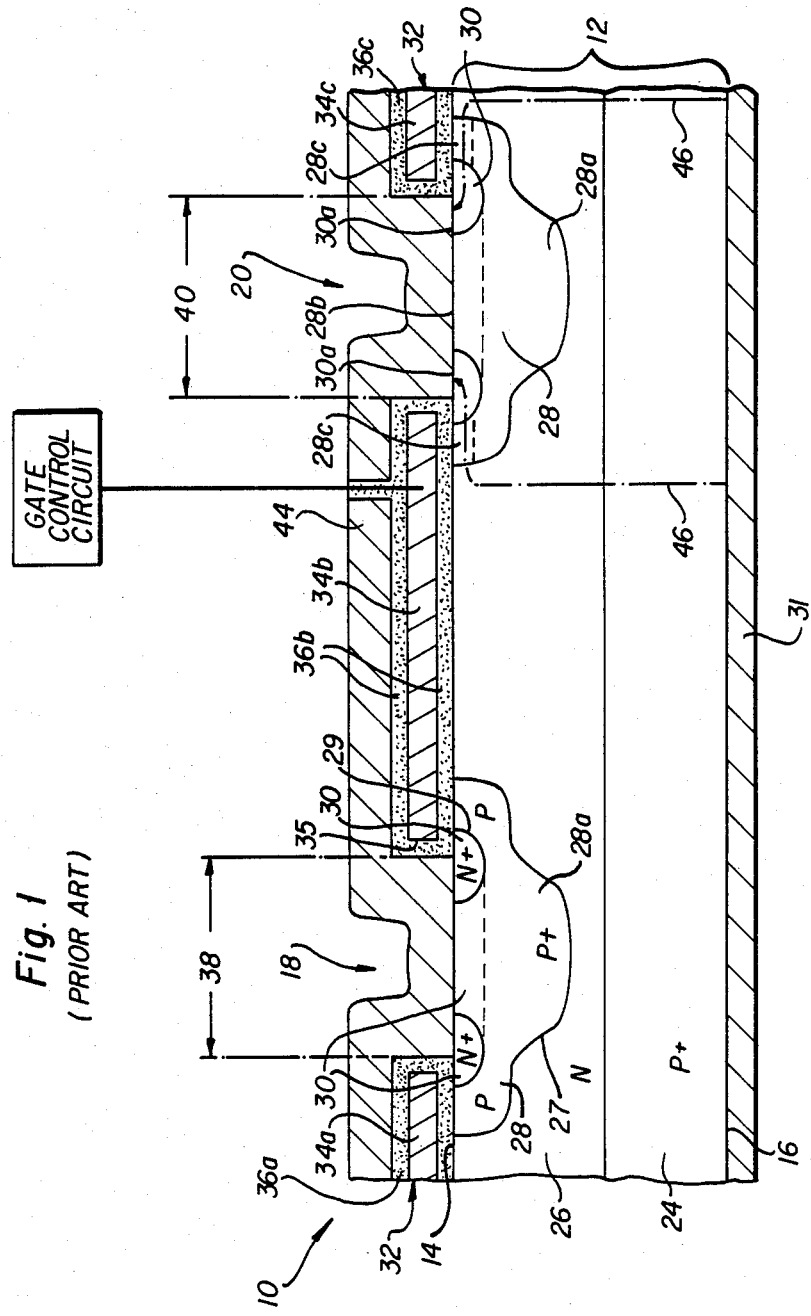
FIG. 1 is a cross-sectional view of an insulated gate transistor (IGT) characteristic of prior art devices.

Referring now to the drawings, FIG. 1 shows a portion of a conventional IGT 10, implemented in a silicon semiconductor substrate or wafer 12 having opposing major surfaces 14 and 16 and including two substantially identical cells, indicated generally at 18 and 20 respectively. Each of cells 18 and 20 is oriented orthogonally to major surface 14 and includes, in series: A portion of a P+ collector region 24, an adjacent portion of an N drift region 26, a P base region 28 extending from major surface 14 into drift region 26 and forming a base-drift junction 27 therewith, and a continuous N+ emitter region 30 extending from major surface 14 into base region 28 and forming an emitter-base junction 29 with the latter. As used herein, the symbols "+" and "−" represent relative dopant concentrations.

Figure 2:
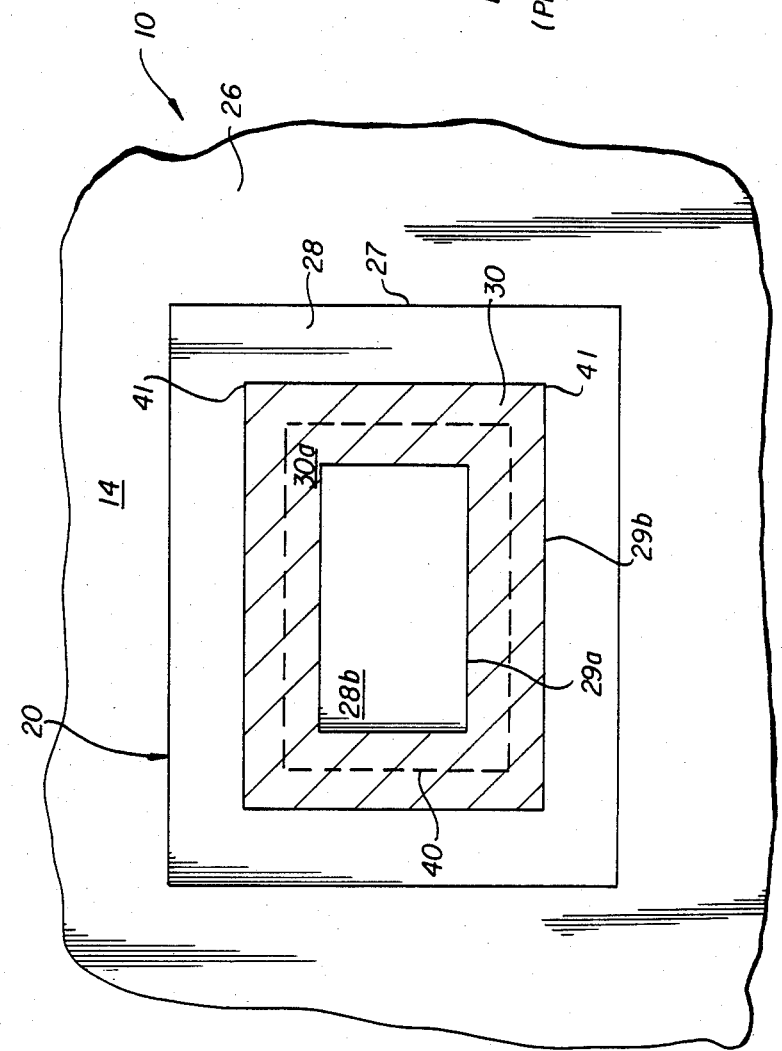
FIG. 2 is a plan view illustrating selected features of the IGT of FIG. 1.

The continuous nature of the emitter region in prior art devices is best seen with reference to FIG. 2. Each cell base region 28 includes a central P+ portion, indicated at 28a and having a surface 28b at major surface 14. Central base portion 28 extends deeply into N drift region 26. Emitter region surface 30a is seen to completely surround central base portion surface 28b at major surface 14, thus separating the base region into two portions.

Referring again to FIG. 1, a collector electrode 31, preferably consisting of metal, is disposed in ohmic contact with collector region 24 at major surface 16. A gate structure 32 includes a gate electrode in the form of a distributed, electrically conductive layer overlying major surface 14 and insulatively spaced therefrom by a surrounding insulating region. Portions of this gate electrode are indicated at 34a–34c, while portions of the insulating region are indicated at 36a–36c in FIG. 1. The gate electrode preferably consists of a polysilicon material, while the insulating region preferably comprises silicon dioxide. The gate electrode is electrically connected to a gate control circuit which applies the gate bias voltage for device current control.

Gate structure 32 further has a plurality of contact windows defined between the edges of adjacent insulating region portions. In FIG. 1, contact windows 38 and 40 overlie cells 18 and 20 respectively, each cell being centered on its corresponding contact window. Thus, contact window 40 exposes an area of major surface 14, which includes a portion of surface 30a of emitter region 30, as well as central base portion surface 28b of central base portion 28a. Similarly, contact window 38, which overlies cell 18, centered thereon, exposes corresponding surfaces of the latter cell. The shapes of these surfaces can best be seen by reference to FIG. 2.

A distributed emitter electrode 44, preferably consisting of a metallic layer, overlies insulating region portions 36a–36c and makes ohmic contact with the emitter and with a portion of the base region surface of the particular cell exposed within each contact window. At cell 20, emitter electrode 44 is seen to occupy contact window 40 and to make ohmic contact with exposed major surface 14. As stated above, at that location major surface 14 includes a portion of emitter region surface 30a and central base portion surface 28b. Corresponding contact is made between emitter electrode 44 and the exposed base and emitter region surfaces of cell 18.

Cells such as cells 18 and 20 are typically fabricated in the construction of an IGT by first forming gate structure 32 over surface 14 of wafer 12 in which drift region 26 and collector region 24 have been previously formed. Next, central base portions 28a are formed by deep P+ diffusion into major surface 14 through a first set of windows opened in a silicon nitride layer. Each central base portion 28a thus extends from the major surface into the drift region. It will be understood that at least some of the oxide and silicon nitride layers exist only during certain fabrication steps and are later removed. Subsequently, a thick oxide layer is grown over the first set of windows.

A second set of windows, each surrounding a central base portion, is then opened. Shallow P diffusion through the second windows into drift region 26 forms the remainder of base region 28 in each cell. Shallow N+ diffusion into the base region, also through the second windows, is used to form emitter regions 30. Each emitter region thus extends from major surface 14 into base region 28, with emitter region surface 30a surrounding central base portion surface 28b. As will be appreciated from a consideration of the foregoing description of the fabrication process, the size and configuration of the cell base and emitter regions, as well as their respective surfaces exposed through the overlying contact windows, can be selected and controlled during fabrication.

The operation of IGT 10 will become clear from a consideration of cell 20 of FIG. 1, which is typical of the operation of the remaining cells. To initiate a forward conducting mode of operation, an appropriate bias voltage is applied to the distributed gate electrode 34. When this bias voltage exceeds a threshold level, an electrical field is established in base region 28. This creates an N conductivity type channel in the base region, two portions of which are indicated at 28c. The depth of the channel, as measured from major surface 14, is controlled by the applied gate bias voltage. As shown, channel portions 28c are situated adjacent major surface 14 and beneath gate electrode portions 34b and 34c. As mentioned earlier, each channel and each emitter region has a shape approaching that of half a toroid formed by the intersection of a plane at right angles to the toroid axis. Thus, the shape of the contact window is similar to the shape of the toroid surface at major surface 14, i.e. rectangular, square or round. Collector electrode 31 is concurrently biased to a positive potential with respect to emitter electrode 44, and current paths for the device current are thus developed between these electrodes through channel portions 28c and along the paths indicated by arrows 46.

FIG. 2 is a plan view of cell 20 of IGT 10, with emitter electrode 44 and gate structure 32 omitted to illustrate details of cell 20 at major surface 14. Base region 28 is seen to have a generally rectangular surface bounded by base-drift junction 27 and surrounded by drift region 26. Emitter region 30, cross-hatched to show its exposed surface shape, is seen to also have a generally rectangular surface, including a centrally disposed aperture defined by an inner edge 29a of base-emitter junction 29. The aperture so formed exposes central base portion surface 28b of base region 28. Rectangular contact window 40, shown in dash line, exposes central base portion surface 28b and a portion of surface 30a of emitter region 30 for contact with emitter electrode 44, the latter being shown in FIG. 1.

Emitter region 30 is further bounded by an outer edge 29b of emitter-base junction 29 and is surrounded by base region 28. The width of the portion of outer edge 29b which is parallel the adjacent portion of base-drift junction 27 determines the magnitude of the gate periphery. For the cell in FIG. 2, this is the entire outer edge 29b. The gate periphery and the channel depth define the cross-sectional area available for current flow through the channel. Due to a phenomenon known as "current crowding", which occurs principally during turn-off of the device, the weakest part of each square or rectangular cell, i.e. the part where cell latch-up first occurs, is at the corners 41 of the base-emitter junction. In prior art devices of the type shown in FIGS. 1 and 2, this produces the undesirable effect of reducing the threshold voltage $V_{th}$ at which latch-up takes place. Once latch-up occurs, the device current is no longer controlled by the gate bias voltage and the device acts essentially like a thyristor.

Figure 3:
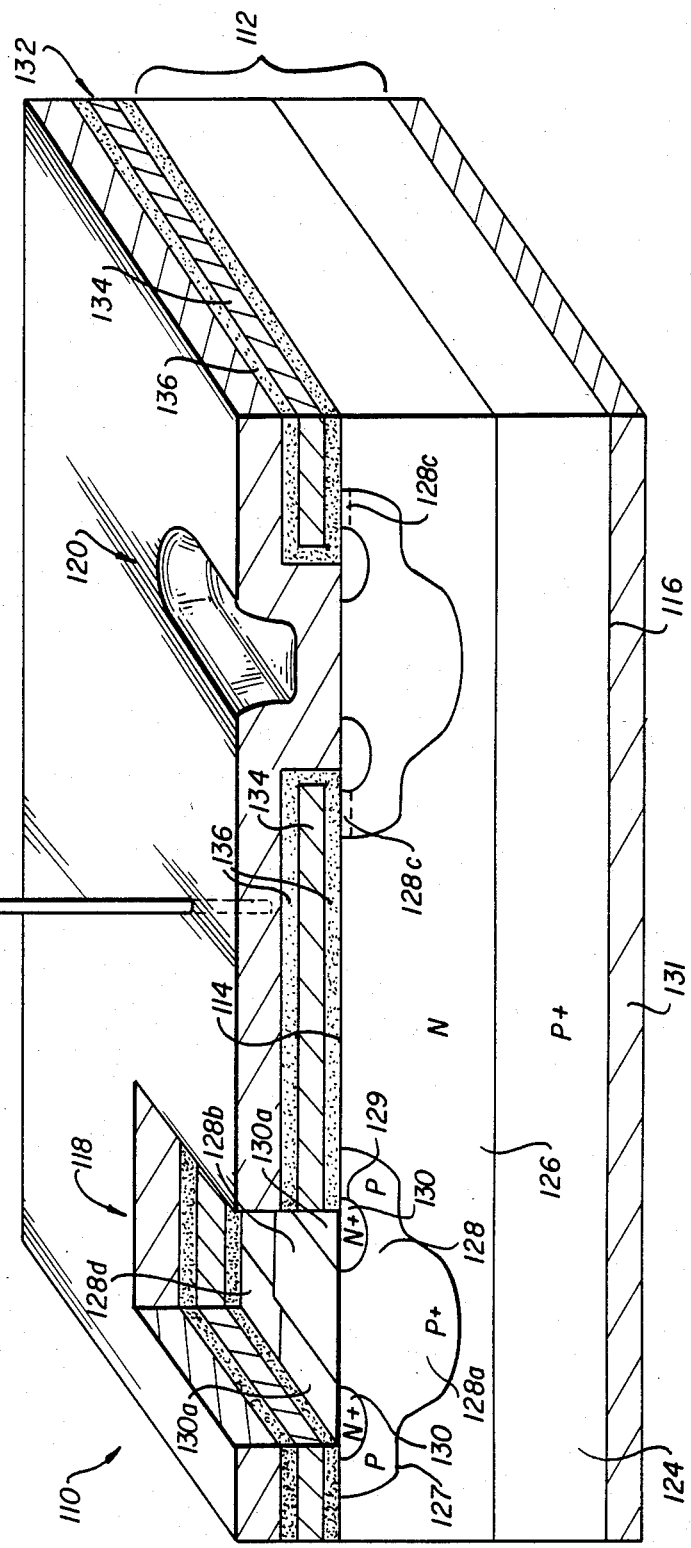
FIG. 3 is on isometric representation, partially in cross-section and partially cut away, of an IGT cell constructed in accordance with the present invention.
Figure 4:
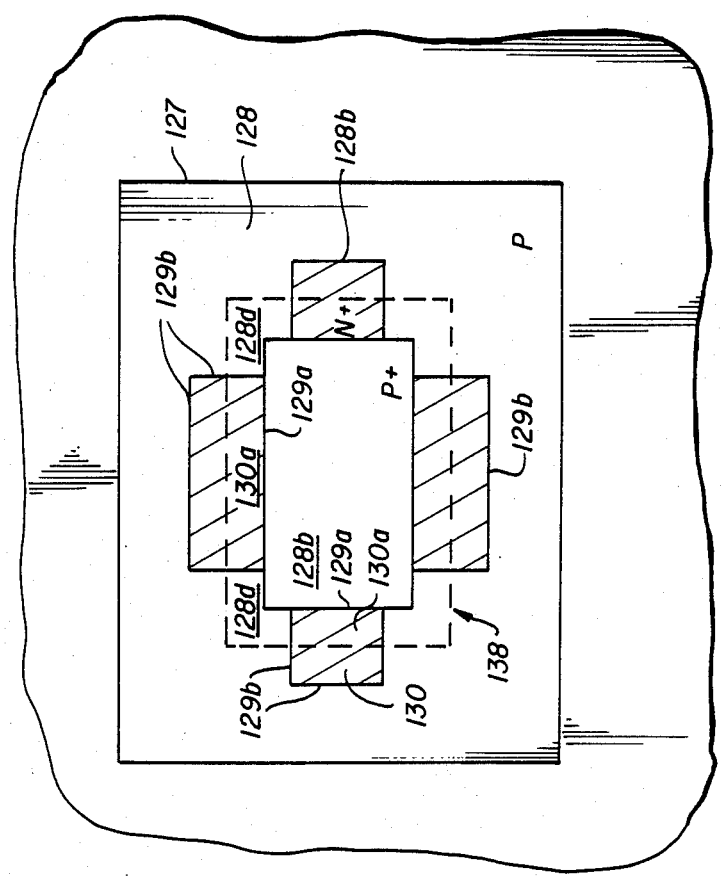
FIG. 4 is a plan view illustrating selected features of a representative cell in the IGT of FIG. 3.

FIGS. 3 and 4 illustrate different views of a portion of an IGT constructed in accordance with the present invention. As shown, the corners of the base-emitter junction for each cell have been removed, so that there is no emitter region adjoining the corners of the central base region. FIG. 3 shows a portion of an IGT 110 comprising a wafer 112 having opposing major surfaces 114 and 116. A pair of cells 118 and 120 is illustrated, with cell 118 shown partially cut away. Cell 118 includes in series: a P+ collector region 124, an adjacent N drift region 126, a P base region 128 extending from major surface 114 into drift region 126, and four mutually spaced, discrete N+ emitter regions 130, best shown in FIG. 4, which extend from major surface 114 into base region 128. Each cell base region includes a central P+ portion extending deeply into drift region 126, indicated at 128a.

A collector electrode 131 is disposed in ohmic contact with collector region 124 at major surface 116. A gate structure 132 overlies major wafer surface 114. The gate structure includes a gate electrode 134 in the form of a distributed, electrically conductive layer overlying major surface 114 and insulatively spaced therefrom by a surrounding insulating region 136. Gate structure 132 is configured to provide a plurality of contact windows defined by the edges of insulating region 136, wherein one cell underlies each contact window and is centrally aligned therewith. In addition to central base portion surface 128b, each contact window is seen to expose a surface portion 130a of each emitter region 130, and surface portions 128d of the P doped base region located in the corners of the contact window. Base region 128 is bounded by a base-drift junction 127.

These surface features are best seen in FIG. 4, wherein gate structure 132 has been deleted to show a single cell in plan view. A contact window 138, shown in dashed outline, is seen to surround the exposed surfaces. Each emitter region surface 130a is bounded on three sides by an outer edge 129b of an emitter-base junction 129 and by an inner edge 129a on the fourth side. The total of the widths for the four emitter regions 130 of the portions of outer edge 129b, adjacent base-drift junction 127, constitutes the gate periphery for the cell. Thus, the gate periphery of each cell in the present invention is reduced from that of prior art cells. This feature results in reducing the maximum current for each cell below a selected level, i.e. below the latch-up current level.

In place of a single emitter region, as is the case in conventional cells, the present invention provides a number of discrete emitter regions in each cell. The cross-sectional area for current flow for these discrete emitter regions jointly totals less than that for a single emitter region of a conventional cell. To provide the discrete emitter regions, an extra masking step is used in the cell fabrication process, e.g. to block the N+ diffusion at the corners of the contact windows during formation of the emitter regions. Such a step results in the formation of four discrete emitter regions in each cell, as explained above.

Figure 5:
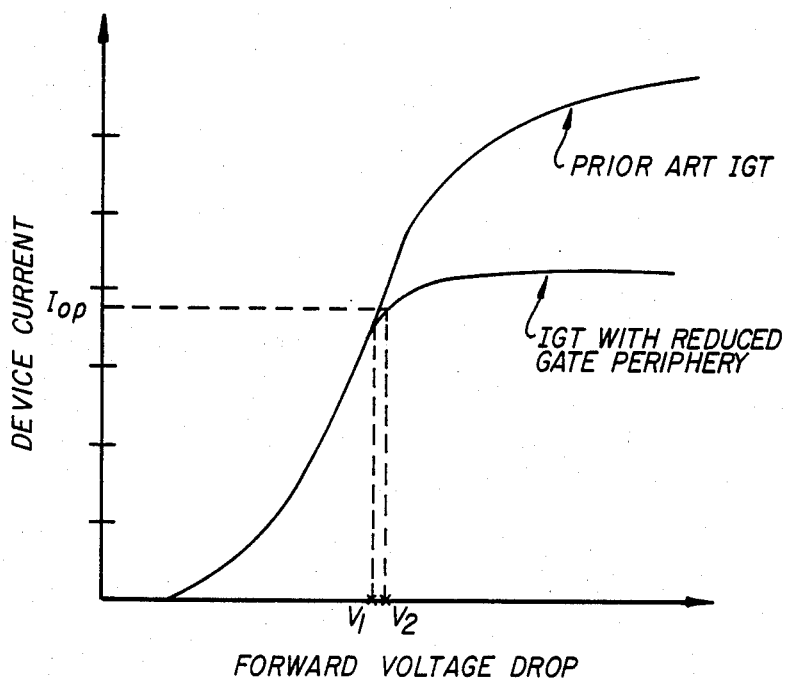
FIG. 5 is a graph comparing the predicted device current with respect to the applied gate voltage of a conventional IGT and of an IGT constructed in accordance with the principles of the present invention.

The operation of the inventive IGTs is similar to the operation of prior art IGTs herein described, except that there are four channels 128c formed in each cell upon application of a bias voltage to gate electrode 134. Since the gate periphery of each cell is now smaller due to the absence of any emitter region in the cell corners, the maximum current which the IGT device can conduct is reduced. As shown by the graph of predicted device current with respect to gate bias voltage characteristics in FIG. 5, the response of the present invention is similar to that of known IGT's up to the device operating current $I_{op}$, except that the invention has a slightly higher forward voltage drop $V_2$ at that current level. However, as shown, the maximum device current is lower than is the case in prior art devices.

As explained above, by limiting the maximum current flow through the IGT to a lower level than would otherwise be the case, the device is capable of surviving a short-circuit condition. Specifically, in a short-circuit condition latch-up does not occur immediately. During that interval as long as gate control is not lost, the gate control circuit will sense the short-circuit condition and will turn the gate bias voltage off. In addition to removing the areas of the emitter region where latch-up due to current crowding is likely to start upon the occurrence of a short circuit condition, the elimination of the emitter corners from each cell in accordance with the present invention also limits the maximum current flow during the turn-off interval to a level below the latch-up current level. Thus, the short-circuit condition is prevented from destroying the device.

The maximum current flow in the device is further reduced by reducing the spacing between cells. For a given voltage rating and operating current level of an IGT, there is an optimum cell spacing to permit a maximum forward current flow through the device without causing latch-up. Optimum cell spacing for a conventional 1200V IGT is about 20 microns. By limiting the cell spacing to about 17 microns in accordance with the present invention, the maximum forward device current is further limited to provide the improved operational characteristics described herein.

In general, optimum cell size is dictated by two factors: Forward voltage drop and latch-up. As a result of the decreased gate periphery and cell spacing in the present invention, there is an increase in the forward voltage drop across the device. To compensate for this, the size of each cell in the present invention is preferably reduced to a size which is below the optimum size used in prior art IGTs. As is known in the art, smaller cells which have been exposed to electron beam irradiation have a smaller forward voltage drop than larger cells. However, such smaller cells are prone to latch at a lower device current level. Since the device maximum current in the present invention is kept below the level at which latch-up occurs by virtue of the reduced gate periphery and the reduced cell spacing, the forward voltage drop may be reduced by reducing cell size. Whereas known cells may have a size of 16×300 microns, experiments have shown that for the present invention, fabricating the cells to dimensions of 20×24 microns for rectangular cells adequately compensates for the increase in the forward voltage drop described above. Thus, the emitter region surface on the sides of such a cell would have dimensions of 10×5 microns and on the ends 14×5 microns.

Figure 6:
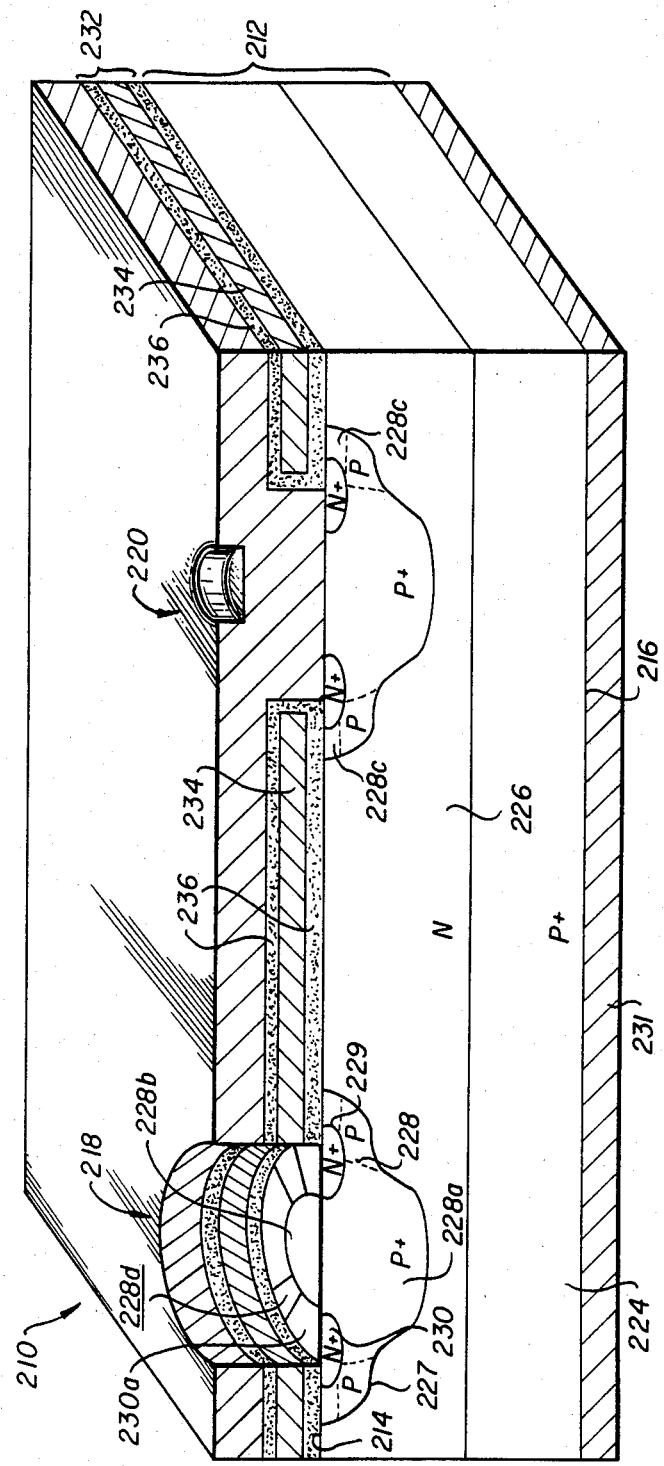
FIG. 6 is an isometric representation, partially in cross-section and partially cut away, of an IGT cell constructed in accordance with the present invention and having a circular cell configuration.

The present invention is also applicable to IGTs of a different cell configuration, e.g. a circular configurations as shown in FIGS. 6 and 7. Since the problem of current crowding exists for the entire emitter-base junction with this type of cell, the portion of the emitter region to be blocked during emitter formation is not limited to the corners here. As in the embodiment shown in FIGS. 3 and 4, the use of multiple emitter regions in each cell, rather than a continuous emitter region, reduces the gate periphery and thus reduces the device maximum current.

FIG. 6 shows a portion of an IGT 210 comprising a wafer 212 having opposing major surfaces 214 and 216. A pair of cells 218 and 220 is illustrated, with cell 218 shown partially cut-away. Cell 218 includes in series: A P+ collector region 224, and adjacent N thrift region 226, a P base region 228 extending from major surface 214 into drift region 226, and at least two mutually spaced, discrete N+ emitter regions 230, best shown in FIG. 7, which extend from major surface 214 into base region 228. The embodiment shown in FIG. 7 includes four emitter regions. As with rectangular cells, each cell base region includes a central P+ portion extending deeply into drift region 226, indicated at 228a.

A collector electrode 231 is disposed in ohmic contact with collector region 224 at major surface 216. A gate structure 232 overlies major wafer surface 214. The gate structure includes a gate electrode 234 in the form of a distributed, electrically conductive layer overlying major surface 214 and insulatively spaced therefrom by a surrounding insulating region 236. Gate structure 232 is configured to provide a plurality of contact windows defined by the edges of insulating region 236, wherein one cell underlies each contact window and is centrally aligned therewith. In addition to central base portion surface 228b, each contact window is seen to expose a surface portion 230a of each emitter region 230 and surface portions 228d of the P doped base region located intermediate the emitter regions and surrounding the central base portion. Base region 228 is bounded by a base-drift junction 227.

The surface features of such a circular cell are best seen in FIG. 7, wherein gate structure 232 has been deleted to show a single cell and plan view. A contact window 238, shown in dashed outline, is seen to surround the exposed surfaces. The circular cell shown in FIG. 7 has four discrete emitter regions. However, the present invention may be practiced by providing two or more discrete emitter regions. Each emitter region surface 230a is bounded on three sides by an outer edge 229b of an emitter-base junction 229 and by an inner edge 229a on the fourth side. As seen, each emitter region surface 230a has the configuration of a portion of an annulus. The features of the present invention function essentially the same with the circular cell configuration as with the previously-described rectangular cell configuration.

The features of the present invention have been primarily described with respect to cells having rectangular contact windows. However, they will also improve the operation of cells with other geometries. It will also be clear that the present invention will work with IGTs in which the conductivity types are reversed from those shown in the drawings and described herein. Additionally, the present invention lends itself to providing short-circuit protection in other types of insulated gate devices, such as for example metal-oxide-semiconductor field-effect transistors (MOSFETS).

While the present invention has been shown and described with reference to a preferred embodiment, it will be understood that numerous modifications, changes, variations, substitutions and equivalents will now occur to those skilled in the art without departing from the spirit and scope of the invention. Accordingly, it is intended that the invention herein be limited only by the scope of the appended claims.

What is claimed is:

1. A semiconductor device comprising:
   a semiconductor wafer having a drift region of a first conductivity type, said drift region including a major surface;
   an insulating region including at least one contact window exposing an area of said major surface;
   a gate electrode separated from said major surface by said insulating region;
   a cell centrally aligned with said contact window and extending beyond the boundaries thereof, said cell including a base region of a second conductivity type extending from said major surface into said drift region and including a central base portion;
   said cell further including a plurality of mutually spaced emitter regions of said first conductivity type disposed about said central base portion and adjacent thereto, each of said emitter regions extending from said major surface into said base region and forming a separate emitter-base junction therewith;

said major surface area exposed by said contact window including a surface of said central base portion, and further including surface portions of said mutually spaced emitter regions and of said base region intermediate said emitter regions respectively adjoining said central base portion surface;

an emitter electrode insulated from said gate electrode and disposed in ohmic contact with said exposed major surface area; and means for applying a bias voltage to said gate electrode to establish a separate channel in said base region adjacent said major surface between each of said emitter regions and said drift region;

whereby said separate emitter-base junctions effect a reduction of the gate periphery of said cell by an amount selected to maintain the maximum current flow from said channels to said emitter regions below the latch-up current level of said cell.

2. A device according to claim 1 wherein said gate periphery is selected to provide said maximum current flow at a predetermined level.

3. A device according to claim 1 wherein said semiconductor device comprises an insulated gate transistor having a collector region of said second conductivity type disposed adjacent said drift region.

4. A device according to claim 3 wherein said device comprises a P-channel insulated gate transistor.

5. A device according to claim 3 wherein said device comprises an N-channel insulated gate transistor.

6. A device according to claim 3 wherein said exposed major surface area and said central base portion surface are rectangular, said last-recited surface being centrally aligned within said exposed major surface area; and said mutually spaced emitter regions being disposed such that no emitter region adjoins a corner area of said central base portion.

7. A device according to claim 6 wherein each of said cells comprises at least four discrete emitter regions each including a rectangularly shaped surface coplanar with said major surface, each of said emitter region surfaces adjoining a separate side of said rectangular central base portion surface and being substantially centered on said side.

8. A device according to claim 3 wherein the size of said cell is selected to minimize the forward voltage drop due to current flow in said device.

9. A device according to claim 8 wherein said insulating region comprises a plurality of said contact windows and a separate cell centrally aligned with each of said windows.

10. A device according to claim 3 wherein said insulating region comprises a plurality of said contact windows mutually spaced from each other and a separate cell centrally aligned with each of said windows, the spacing between said cells being selected to maintain the maximum current flow through said device below the level at which latch-up occurs.

11. A device according to claim 10 wherein the size of each of said cells is selected to minimize the forward voltage drop due to current flow in said device.

12. A device according to claim 11 wherein said exposed major surface area and said central base portion surface in each of said cells are rectangular, each of said central base portion surfaces being centrally aligned within its corresponding exposed major surface area;

each of said cells comprising at least four discrete emitter regions spaced around the central base portion of said cell such that no emitter region adjoins a corner area of said central base portion.

13. A device according to claim 12 wherein each of said emitter region surfaces adjoins a separate side of said rectangular central base portion surface and is substantially centered on said side.

14. A device according to claim 10 wherein each of said contact windows and each of said central base portion surfaces is circular in shape; and said emitter regions being spaced at regular intervals around said central base portion in each of said cells, each of said emitter regions including a surface coplanar with said major surface and configured as a portion of an annulus.

15. A device according to claim 14 wherein the size of each of said cells is selected to minimize the forward voltage drop due to current flow in said device.

* * * * *